US012579331B2

(12) United States Patent
Aonuma et al.

(10) Patent No.: US 12,579,331 B2
(45) Date of Patent: Mar. 17, 2026

(54) MATERIAL DESIGN APPARATUS, MATERIAL DESIGN METHOD, AND MATERIAL DESIGN PROGRAM

(71) Applicant: SHOWA DENKO K.K., Tokyo (JP)

(72) Inventors: Naoto Aonuma, Tokyo (JP); Shimpei Takemoto, Tokyo (JP); Eriko Takeda, Tokyo (JP); Yoshishige Okuno, Tokyo (JP); Hiroki Kuramoto, Tokyo (JP); Yasuaki Kawaguchi, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 1046 days.

(21) Appl. No.: 17/753,402

(22) PCT Filed: Sep. 1, 2020

(86) PCT No.: PCT/JP2020/033121
§ 371 (c)(1),
(2) Date: Mar. 2, 2022

(87) PCT Pub. No.: WO2021/045058
PCT Pub. Date: Mar. 11, 2021

(65) Prior Publication Data
US 2022/0292229 A1 Sep. 15, 2022

(30) Foreign Application Priority Data
Sep. 6, 2019 (JP) ................................. 2019-163105

(51) Int. Cl.
*G06F 30/10* (2020.01)
*G06F 30/27* (2020.01)
(52) U.S. Cl.
CPC .............. *G06F 30/10* (2020.01); *G06F 30/27* (2020.01)

(58) Field of Classification Search
None
See application file for complete search history.

(56) References Cited

U.S. PATENT DOCUMENTS

| 5,260,882 | A | * | 11/1993 | Blanco | ..................... | C07K 1/00 |
| | | | | | | 703/12 |
| 2010/0210745 | A1 | * | 8/2010 | McDaniel | ................ | C09D 7/48 |
| | | | | | | 521/55 |

FOREIGN PATENT DOCUMENTS

| JP | 2003-058582 | 2/2003 |
| JP | 2004-086892 | 3/2004 |

(Continued)

OTHER PUBLICATIONS

D'hooge et al, "Model-based design of the polymer microstructure: bridging the gap between polymer chemistry and engineering", Aug. 20, 2015, Polym. Chem, vol. 6, pp. 7081-7097 (Year: 2015).*

(Continued)

*Primary Examiner* — Rehana Perveen
(74) *Attorney, Agent, or Firm* — IPUSA, PLLC

(57) ABSTRACT

A material design apparatus includes a learned model that has learned a correspondence between input information about a blend proportion of a monomer and output information about physical property values of a polymer by machine learning. Each unit of the material design apparatus is configured to: receive as input a blend proportion range of at least one monomer; receive required ranges of physical property values of a polymer; generate a comprehensive analysis point of a polymer polymerized from multiple monomers, the multiple monomers including, within the blend proportion range, at least one monomer of which the blend proportion range is input; input the generated comprehensive analysis point into the learned model to calculate physical property values of a polymer, to create a data set, (Continued)

and to store the created data set; and select a polymer within the required ranges of the physical property values from the data set.

15 Claims, 12 Drawing Sheets

(56)                    References Cited

FOREIGN PATENT DOCUMENTS

| JP | 2010-198561 | | | 9/2010 |
|----|-------------|---|---|--------|
| JP | 2010191529 | A | * | 9/2010 |
| JP | 4649169 | B2 | * | 3/2011 |

OTHER PUBLICATIONS

Mannodi-Kanakkithodi Arun et al: "Machine Learning Strategy for Accelerated Design of Polymer Dielectrics", D2 Scientific Reports, vol. 6, No. 1, Aug. 26, 2016 (Aug. 26, 2016), XP093074355, DOI: 10.1038/srep20952.
International Search Report of Int. Appl. No. PCT/JP2020/033121 dated Nov. 17, 2020.
Shun Goto et al., "Development of Predictive Models and Reverse Analysis Method for Polymer Design", Journal of Computer Aided Chemistry [online], 2009, vol. 10, pp. 30-37, [retrieved on Nov. 2, 2020], Retrieved from the Internet <URL:https://www.jstage.jst.go.jp/article/jcac/10/0/10_0_30/_article/-char/ja/>, <DOI:10.2751/jcac.10.30>, pp. 31-35, with English Abstract.

* cited by examiner

FIG.9

| | BLEND PROPORTION OF MONOMER | | | FORMULATION INFORMATION | | EVALUATION CONDITION | | PHYSICAL PROPERTY VALUE OF POLYMER | |
|---|---|---|---|---|---|---|---|---|---|
| | monomer 1 | monomer 2 | monomer 3 | INITIA- TOR | INHIBI- TOR | PRE- BAKE | POST- BAKE | GLASS TRAN- SITION POINT | HEAT RESIS- TANCE |
| POLYMER 1 | | | | | | | | | |
| POLYMER 2 | | | | | | | | | |
| POLYMER 3 | | | | | | | | | |
| . . . | | | | | | | | | |

31A

MATERIAL DESIGN APPARATUS, MATERIAL DESIGN METHOD, AND MATERIAL DESIGN PROGRAM

TECHNICAL FIELD

The present disclosure relates to a material design apparatus, a material design method, and a material design program.

BACKGROUND ART

Conventionally, design of a polymer material is performed by repeating trial production while adjusting a composition based on experience of a material developer.

However, trial production based on experience of a material developer often requires repeated trial production until the optimal design is obtained, which requires considerable time and effort. In addition, a condition search is often performed locally in the vicinity of the design condition previously performed by the material developer. Thus, trial production based on experience of a material developer is not suitable for a global search for the optimal design condition.

For example, Patent Literature 1 proposes a material design support system in which, when a desired material function is specified by a material designer, a material candidate that satisfies the material function is presented. According to the material design support system disclosed in Patent Literature 1, a machine learning system such as a neural network can be used as a tool for performing so-called inverse problem analysis for deriving a design condition of a material that satisfies the desired material function (physical property), thereby making prediction of a material candidate more efficient.

CITATION LIST

Patent Literature

[PTL 1]
Japanese Laid-Open Patent Publication No. 2010-198561

SUMMARY OF INVENTION

Technical Problem

However, in the material design support system disclosed in Patent Literature 1, limitation on the number of blending substances and blending order are not taken into consideration. In addition, the polymer material itself is treated as a material to be blended. Thus, the material design support system disclosed in Patent Literature 1 is not suitable for the material design of the polymer itself.

The present disclosure is intended to provide a material design apparatus, a material design method, and a material design program for a polymer material that simultaneously satisfy multiple desired material physical properties.

Solution to Problem

The present disclosure includes the following configurations.

[1]
A material design apparatus for designing a polymer polymerized from multiple types of monomers, the material design apparatus including:

a learned model that has learned a correspondence between input information about a blend proportion of a monomer and output information about a physical property value of a polymer, a blend proportion range input unit configured to receive as input a blend proportion range of at least one monomer, a required physical property input unit configured to receive as input a required range of at least one physical property value of a polymer, a comprehensive analysis point generation unit configured to generate a comprehensive analysis point of a polymer polymerized from multiple monomers, the multiple monomers including, within the blend proportion range, at least one monomer of which the blend proportion range is input, a comprehensive analysis point-polymer physical property value storage unit configured to input the generated comprehensive analysis point into the learned model to calculate a physical property value of a polymer, to create a data set in which the comprehensive analysis point and the calculated physical property value of the polymer are linked, and to store the created data set, and a filter unit configured to select a polymer within the required range of the physical property value input in the required physical property input unit from the data set.

[2]
The material design apparatus according to [1], wherein in the blend proportion range input unit, a number of monomers used for polymerization is input, and the number of monomers used for polymerization is limited, and wherein a comprehensive analysis point of a polymer polymerized using a limited number of monomers is generated.

[3]
The material design apparatus according to [1] or [2], wherein in the blend proportion range input unit, at least one monomer is input as essential for polymerization from among monomers of which the blend proportion range is input, and wherein a comprehensive analysis point of a polymer polymerized from multiple monomers including an essential monomer within the blend proportion range is generated.

[4]
A material design apparatus for designing a graft polymer polymerized in two stages from multiple types of monomers, the material design apparatus including:

a learned model that has learned a correspondence between input information about a blend proportion of a monomer and output information about a physical property value of a polymer, a blend proportion range input unit configured to receive as input a blend proportion range of at least one monomer, a required physical property input unit configured to receive as input a required range of at least one physical property value of a polymer, a first stage comprehensive analysis point generation unit configured to select at least one first stage monomer used for first stage polymerization from among monomers of which the blend proportion range is input, and to generate a comprehensive analysis point of a main chain polymer polymerized using multiple monomers including the at least one first stage monomer within the blend proportion range, a second stage monomer proposal unit configured to propose at least one monomer used for a second stage polymerization with the main chain polymer based on a first stage comprehensive analysis point, an integrated comprehensive analysis point generation unit configured to polymerize a graft polymer from a second stage monomer and the main chain polymer, and to generate an integrated comprehensive analysis point of the graft polymer, a comprehensive analysis point-polymer physical property value storage unit configured to input the integrated comprehensive analysis point into the learned model to calculate a physical property value of a graft polymer, to create a data set in which the integrated comprehensive analysis point and the calculated physical property value of the graft polymer are linked, and to store the created data set, and a filter unit configured to select a graft polymer within the required range of the physical property value input in the required physical property input unit from the data set.

[5]

The material design apparatus according to [4], wherein in the blend proportion range input unit, a number of monomers used for polymerization is input, and the number of monomers used for polymerization is limited, and wherein an integrated comprehensive analysis point of a graft polymer polymerized using a limited number of monomers is generated.

[6]

The material design apparatus according to [4] or [5], wherein in the blend proportion range input unit, at least one monomer is input as essential for polymerization from among monomers of which the blend proportion range is input, and wherein in the integrated comprehensive analysis point generation unit, a comprehensive analysis point of a graft polymer polymerized from multiple monomers including an essential monomer within the blend proportion range is generated.

[7]

The material design apparatus according to [4] or [5], wherein in the blend proportion range input unit, unit, at least one monomer is input as essential for first stage polymerization from among monomers of which the blend proportion range is input, and wherein in the first stage comprehensive analysis point generation unit, a comprehensive analysis point of a main chain polymer polymerized from multiple monomers including an essential monomer within the blend proportion range is generated.

[8]

A material design method for designing a polymer polymerized from multiple types of monomers, the material design method including:

creating a learned model that has learned a correspondence between input information about a blend proportion of a monomer and output information about a physical property value of a polymer, receiving as input a blend proportion range of at least one monomer, receiving as input a required range of at least one physical property value of a polymer, generating a comprehensive analysis point of a polymer polymerized using, within the blend proportion range, at least one monomer of which the blend proportion range is input, inputting the comprehensive analysis point into the learned model to calculate a physical property value of a polymer, creating a data set in which the comprehensive analysis point and the calculated physical property value of the polymer are linked, and storing the created data set in a comprehensive analysis point-polymer physical property value storage unit, and selecting a polymer within the required range of the physical property value from the data set.

[9]

A non-transitory computer-readable recording medium storing a material design program for designing a polymer polymerized from multiple types of monomers, the material design program causing a computer to implement functions including:

creating a learned model that has learned a correspondence between input information about a blend proportion of a monomer and output information about a physical property value of a polymer, receiving as input a blend proportion range of at least one monomer, receiving as input a required range of at least one physical property value of a polymer, generating a comprehensive analysis point of a polymer polymerized using, within the blend proportion range, at least one monomer of which the blend proportion range is input, inputting the comprehensive analysis point into the learned model to calculate a physical property value of a polymer, creating a data set in which the comprehensive analysis point and the calculated physical property value of the polymer are linked, and storing the created data set in a comprehensive analysis point-polymer physical property value storage unit, and selecting a polymer within the required range of the physical property value from the data set.

[10]

The material design apparatus according to [4], wherein when a particular monomer is selected as the first stage monomer, a learned model that has learned the particular monomer and a monomer constituting the main chain polymer as different substances is used.

[11]

A material design method for designing a graft polymer polymerized in two stages from multiple types of monomers, the material design method including:

creating a learned model that has learned a correspondence between input information about a blend proportion of a monomer and output information about a physical property value of a polymer, receiving as input a blend proportion range of at least one monomer, receiving as input a required range of at least one physical property value of a polymer, selecting at least one first stage monomer used for first stage polymerization from among monomers of which the blend proportion range is input, and to generate a comprehensive analysis point of a main chain polymer polymerized using multiple monomers including the at least one first stage monomer within the blend proportion range, proposing at least one monomer used for a second stage polymerization with the main chain polymer based on a first stage comprehensive analysis point, polymerizing a graft polymer from a second stage monomer and the main chain polymer, and to generate an integrated comprehensive analysis point of the graft polymer, inputting the integrated comprehensive analysis point into the learned model to calculate a physical property value of a graft polymer, to create a data set in which the integrated comprehensive analysis point and the calculated physical property value of the graft polymer are linked, and to store the created data set, and selecting a graft polymer within the required range of the physical property value from the data set.

[12]

A non-transitory computer-readable recording medium storing a material design program for designing a graft polymer polymerized in two stages from multiple types of monomers, the material design program causing a computer to implement functions including:

creating a learned model that has learned a correspondence between input information about a blend proportion of a monomer and output information about a physical property value of a polymer, receiving as input a blend proportion range of at least one monomer receiving as input a required range of at least one physical property value of a polymer.

selecting at least one first stage monomer used for first stage polymerization from among monomers of which the blend proportion range is input, and to generate a comprehensive analysis point of a main chain polymer polymerized using multiple monomers including the at least one first stage monomer within the blend proportion range, proposing at least one monomer used for a second stage polymerization with the main chain polymer based on a first stage comprehensive analysis point, polymerizing a graft polymer from a second stage monomer and the main chain polymer, and to generate an integrated comprehensive analysis point of the graft polymer, inputting the integrated comprehensive analysis point into the learned model to calculate a physical property value of a graft polymer, to create a data set in which the integrated comprehensive analysis point and the calculated physical property value of the graft polymer are linked, and to store the created data set, and selecting a graft polymer within the required range of the physical property value from the data set.

Advantageous Effects of Invention

According to the present disclosure, a material design apparatus, a material design method, and a material design program that allow design of a polymer that satisfies desired physical properties in a short time, can be provided.

BRIEF DESCRIPTION OF THE DRAWINGS

FIG. 9 A diagram illustrating an example of a data set stored in a comprehensive analysis point-polymer physical property value storage unit;

DESCRIPTION OF EMBODIMENTS

Figure 1:
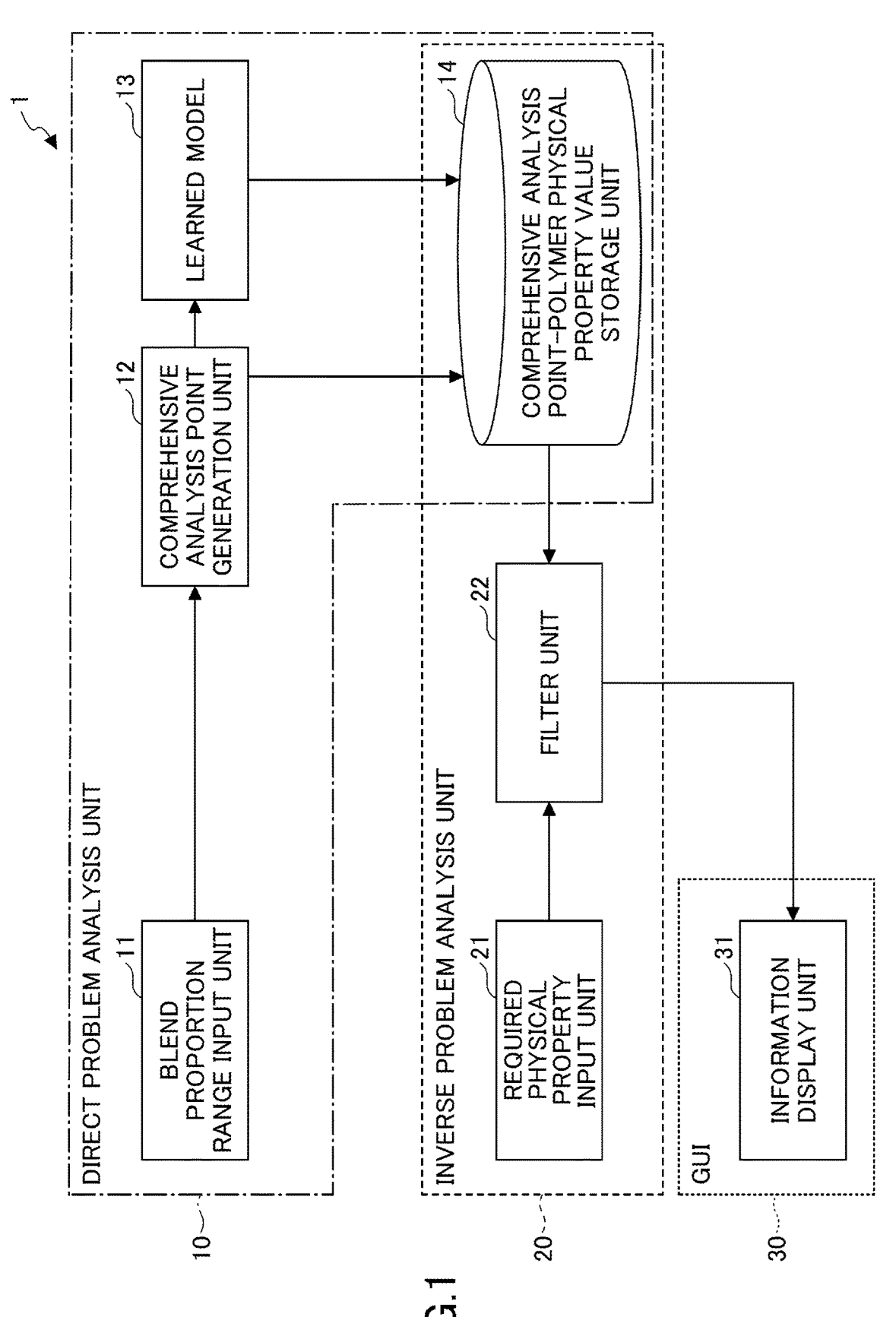
FIG. 1 A block diagram illustrating an example of a schematic configuration of a material design apparatus according to an embodiment.

Hereinafter, embodiments will be described with reference to the accompanying drawings. In order to facilitate the understanding of the description, the same elements in each drawing are, as far as possible, designated by the same reference numerals, and the overlapping description is omitted.

Referring to FIGS. 1 to 11, a configuration of a material design apparatus 1 according to the embodiment will be described. FIG. 1 is a block diagram illustrating an example of a schematic configuration of the material design apparatus 1 according to the embodiment. The material design apparatus 1 is an apparatus for designing a polymer polymerized from multiple types of monomers.

As illustrated in FIG. 1, the material design apparatus 1 includes a direct problem analysis unit 10, an inverse problem analysis unit 20, and a graphical user interface (GUI) 30. The direct problem analysis unit 10 uses a learned model 13 to generate a comprehensive analysis point of a polymer polymerized from multiple monomers, the multiple monomers including, within the blend proportion range, at least one monomer of which a blend proportion range is input by the material designer. The inverse problem analysis unit 20 selects the data set that satisfies the required range of the physical property value input by the material designer, from the data set created based on the comprehensive analysis point generated by the direct problem analysis unit 10. The GUI 30 is an interface having a function such as displaying an output result of the direct problem analysis unit 10 and the inverse problem analysis unit 20, and presenting the output result to the material designer.

The direct problem analysis unit 10 includes a blend proportion range input unit 11, a comprehensive analysis point generation unit 12, the learned model 13, and a comprehensive analysis point-polymer physical property value storage unit 14.

To the blend proportion range input unit 11, a blend proportion range of at least one monomer constituting the polymer to be designed is input. For example, the blend proportion range input unit 11 may display a monomer list to be analyzed on the GUI 30 to prompt the material designer to input.

Figure 3:
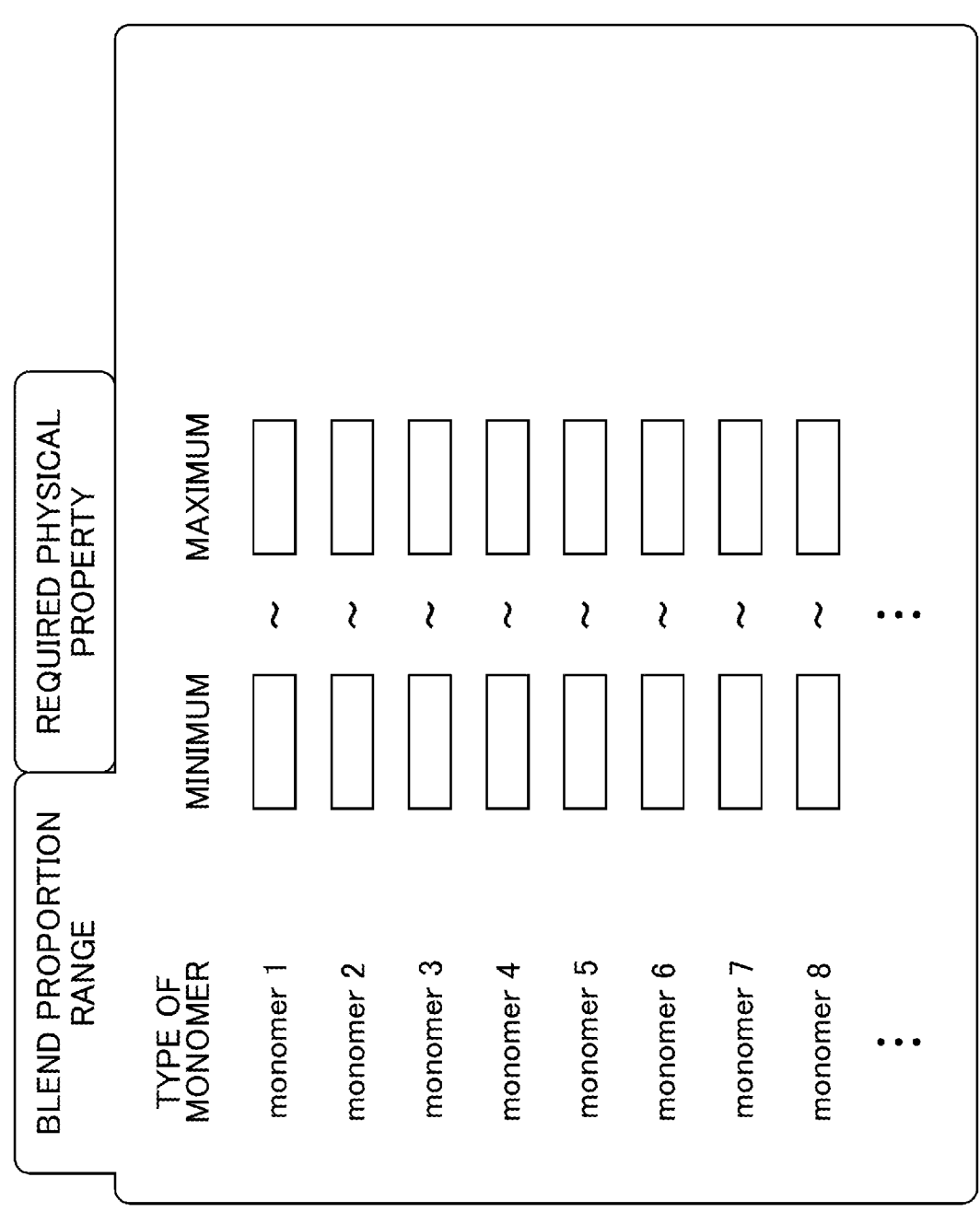
FIG. 3 A diagram illustrating an example of an input screen of a blend proportion range input unit.

The item of the blend proportion range input unit 11 includes a blend proportion of the monomer. FIG. 3 is a diagram illustrating an example of an input screen 11A of the blend proportion range input unit 11. On the input screen 11A, a pre-prepared monomer list is displayed, and the minimum value and the maximum value of the blend proportion range for each monomer can be input.

The item of the blend proportion range input unit 11 may further include evaluation conditions such as an amount of a polymerization initiator or a polymerization inhibitor, a solvent used for polymerization, post-bake temperature and time, and the like.

The comprehensive analysis point generation unit 12 generates a comprehensive analysis point of a polymer polymerized using multiple monomers, the multiple monomers including, within the blend proportion range, at least one monomer of which a blend proportion range is input in the blend proportion range input unit 11. For example, when the blend proportion ranges of three monomers of monomer 1, monomer 2, and monomer 3 are input and the three monomers are selected to be used for polymerization, first, the element of which the blend proportion is finally determined is randomly determined. For example, in a case where the blend proportion of monomer 3 is finally determined, first, multiple combinations of blend proportions, in a random or predetermined step width, are created as combinations of blend proportions of monomer 1 and monomer 2, within each of the input blend proportion range. Next, the blend proportion of monomer 3 is determined so that the sum of the blend proportions is 1 (that is, the total number of monomers constituting the polymer is 100%). From among the combinations of the blend proportions including the blend proportion of monomer 3, the combination of the blend proportions is selected that falls within the blend proportion range of monomer 3 input in the blend proportion range input unit 11. Then, a comprehensive analysis point of the polymer polymerized with the selected combination of the blend proportions is generated.

In the blend proportion range input unit 11, the number of monomers used for polymerization may be input and the number of monomers used for polymerization may be limited. When the number of monomers used for polymerization is limited, in the comprehensive analysis point generation unit 12, the comprehensive analysis point of a polymer polymerized using a limited number of monomers is generated.

Figure 4:
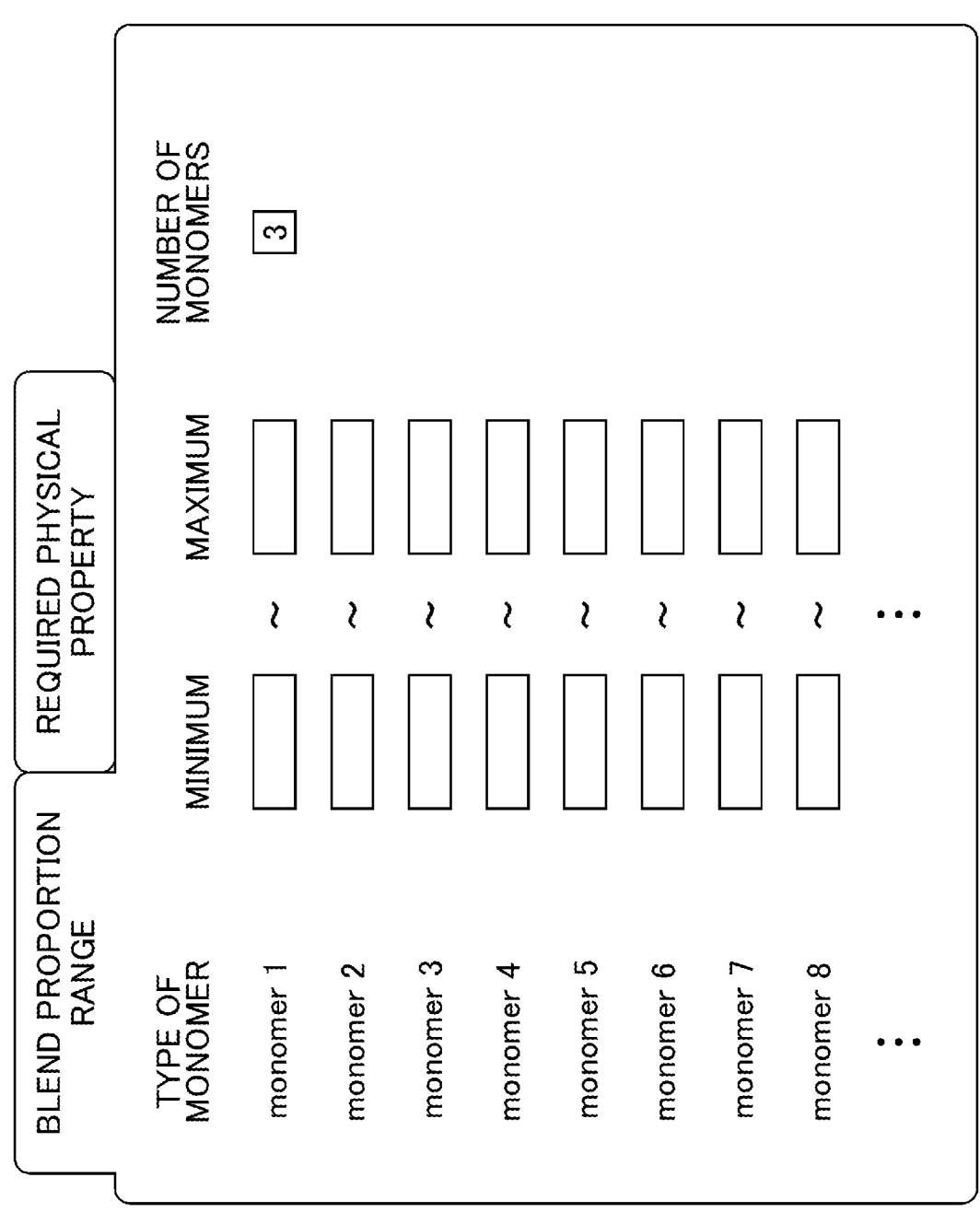
FIG. 4 A diagram illustrating an example of an input screen of the blend proportion range input unit.

FIG. 4 is a diagram illustrating an example of an input screen 11B of the blend proportion range input unit 11 when the number of monomers used for polymerization is input and the number of monomers used for polymerization is limited. In the input screen 11B, "3" is input as the number of monomers used for polymerization, and the number of monomers used for polymerization is limited to "3".

When the number of monomers used for polymerization is limited, in the comprehensive analysis point generation unit 12, a comprehensive analysis point of a polymer polymerized using the limited number of monomers is generated within the blend proportion range input in the blend proportion range input unit 11. For example, when the number of monomers is "3", three monomers are selected in which the maximum value of the blend proportion range input in the blend proportion range input unit 11 is not 0. For example, an example of generating a comprehensive analysis point when monomer 1, monomer 2, and monomer 3 are selected from among the monomers of which the blend proportion range is input, is described. First, the monomer of which the blend proportion is finally determined is randomly selected. For example, in a case where the blend proportion of monomer 3 is finally determined, first, multiple blend proportions are calculated in a random or predetermined step width within the input blend proportion range of monomer 1 and monomer 2, and the combinations of the blend proportions for all of the calculated blend proportions are created. Next, the blend proportion of monomer 3 is determined so that the sum of the blend proportions is 1 (that is, the total number of monomers constituting the polymer is 100%). A comprehensive analysis point of the polymer polymerized with the combination of the blend proportions is generated, among the created combinations of the blend proportions, that falls within the blend proportion range of monomer 3 input in the blend proportion range input unit 11.

In the blend proportion range input unit 11, at least one monomer may be input as essential for polymerization from among the monomers of which the blend proportion range is input. When an essential monomer is input, in the comprehensive analysis point generation unit 12, a comprehensive analysis point of a polymer polymerized from multiple monomers including the essential monomer within the blend proportion range is generated.

Figure 5:
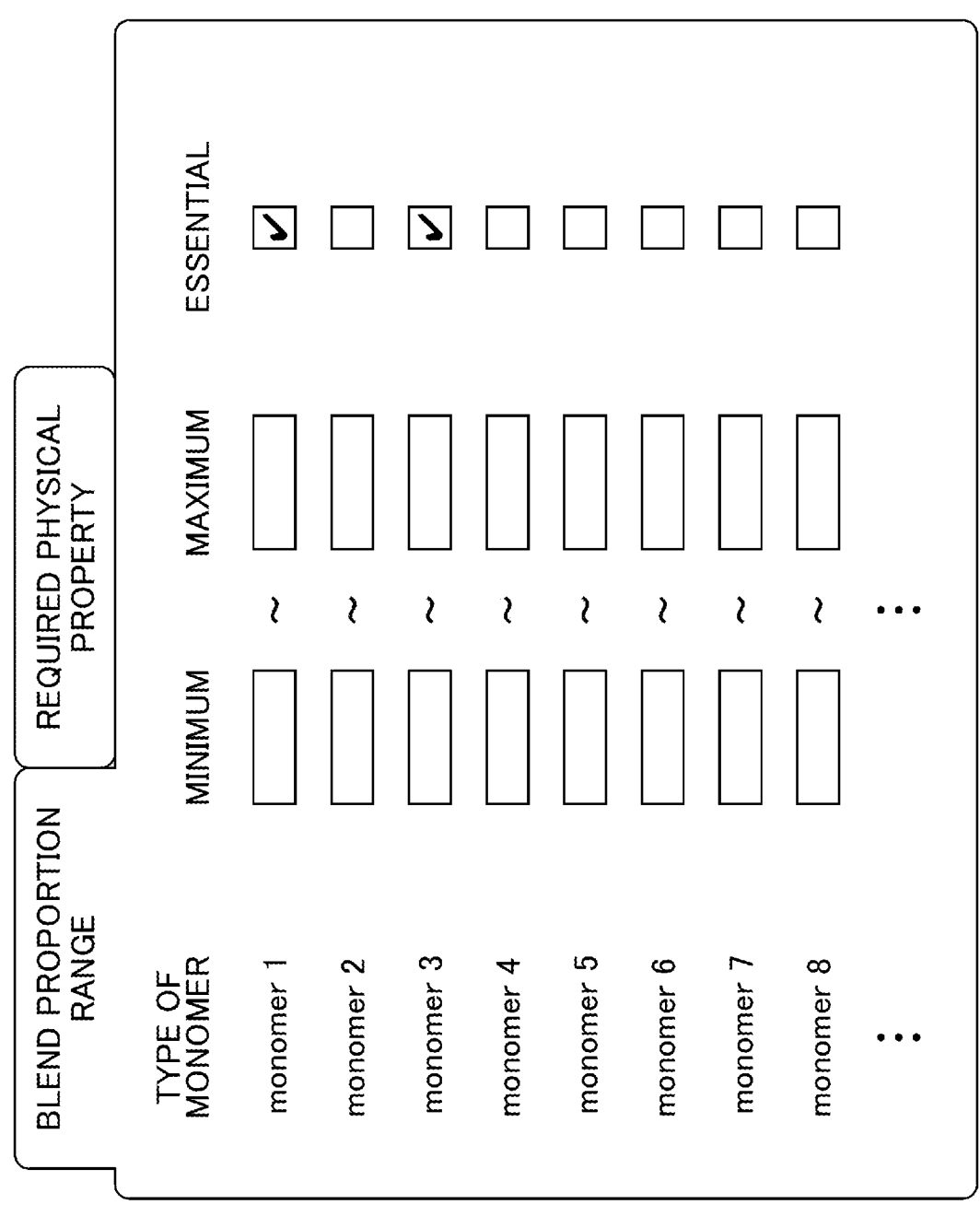
FIG. 5 A diagram illustrating an example of an input screen of the blend proportion range input unit.

FIG. 5 is a diagram illustrating an example of an input screen 11C of the blend proportion range input unit 11 when at least one monomer is input as essential for polymerization from among the monomers of which the blend proportion range is input. In the example of the input screen 11C, monomer 1 and monomer 3 are input as essential monomers.

When the essential monomer is input, in the comprehensive analysis point generation unit 12, a comprehensive analysis point of a polymer polymerized from multiple monomers including monomer 1 and monomer 3 as the essential monomers within the blend proportion range respectively, are generated.

The learned model 13 is a formula obtained by learning in advance the correspondence between input information including a blend proportion range of a polymer and output information including a physical property value of the polymer by machine learning. As the learned model 13, for example, a supervised learning model such as a neural network, a genetic algorithm, or the like may be applied.

The comprehensive analysis point-polymer physical property value storage unit 14 inputs the comprehensive analysis point generated by the comprehensive analysis point generation unit 12 into the learned model 13 to calculate a physical property value of a polymer, creates a data set in which the comprehensive analysis point and the calculated physical property value of the polymer are linked, and stores the created data set. FIG. 9 is a diagram illustrating an example of a data set stored in the comprehensive analysis point-polymer physical property value storage unit 14. As illustrated in FIG. 9, the blend proportion of monomers, which is the input information of the learned model 13, and the physical property value of the polymer, which is the output information, are recorded as one data set on the same row. Each row of the data set stored in the comprehensive analysis point-polymer physical property value storage unit 14 corresponds to the physical property value of each polymer of the generated comprehensive analysis point. Additionally, formulation information such as an amount of a polymerization initiator and a polymerization inhibitor, a solvent used for polymerization, and the like, and evaluation conditions such as post-bake temperature and time, may further be included.

As described above, in the direct problem analysis unit 10, it is configured so that a material designer simply inputs a blend proportion range of at least one monomer, and a data set is automatically generated that includes a comprehensive analysis point of the polymer covering all of the blend proportion range of the monomer and a physical property value of the polymer generated based on the blend proportion.

The inverse problem analysis unit 20 includes a required physical property input unit 21 and a filter unit 22. The comprehensive analysis point-polymer physical property value storage unit 14 described above is also included in the inverse problem analysis unit 20.

In the required physical property input unit 21, a required range of at least one physical property value of the polymer to be designed is input. For example, the required physical property input unit 21 may display an input screen of the required range of the physical property value on the GUI 30 to prompt to input.

Figure 8:
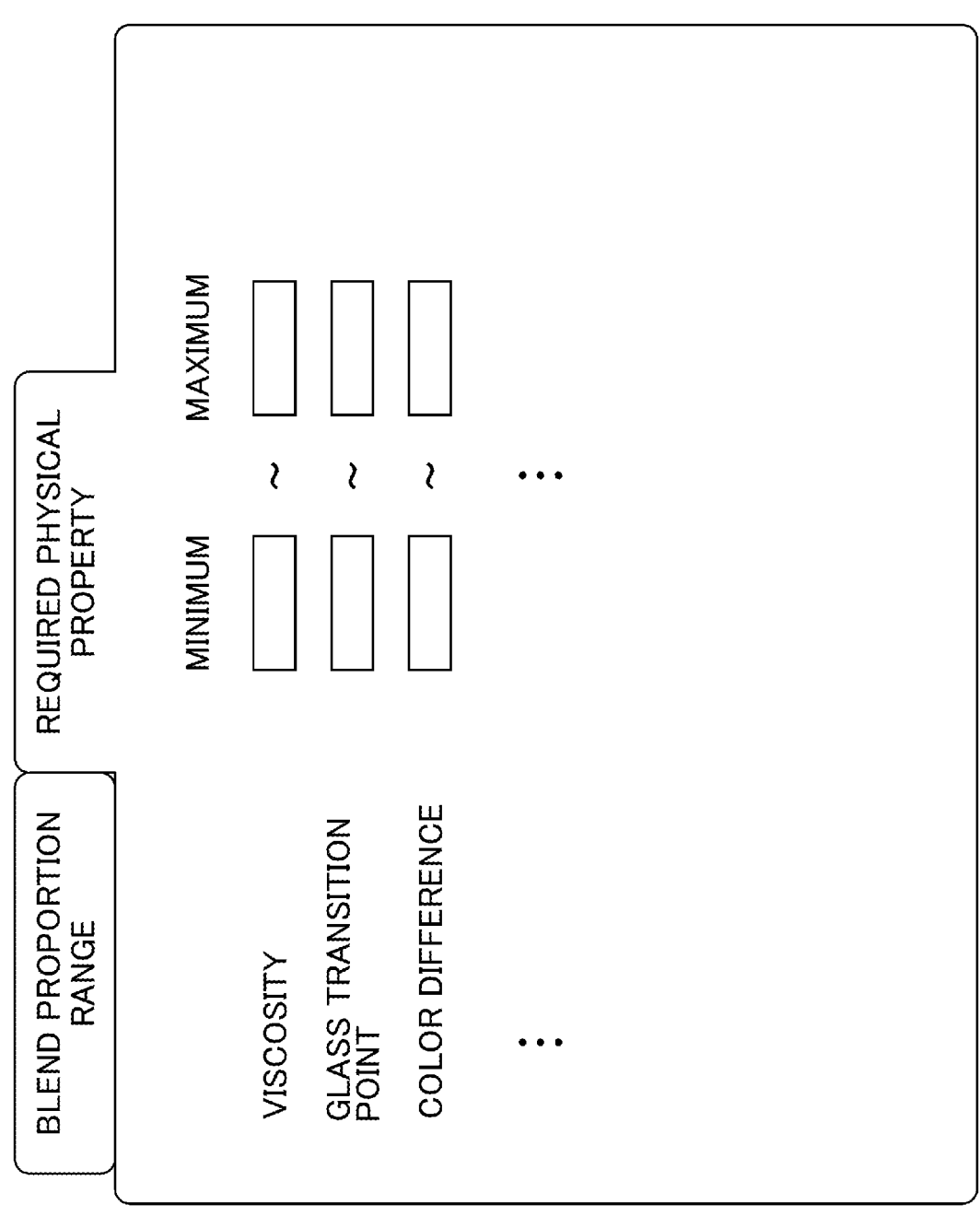
FIG. 8 A diagram illustrating an example of an input screen of a required physical property input unit.
Figure 10:
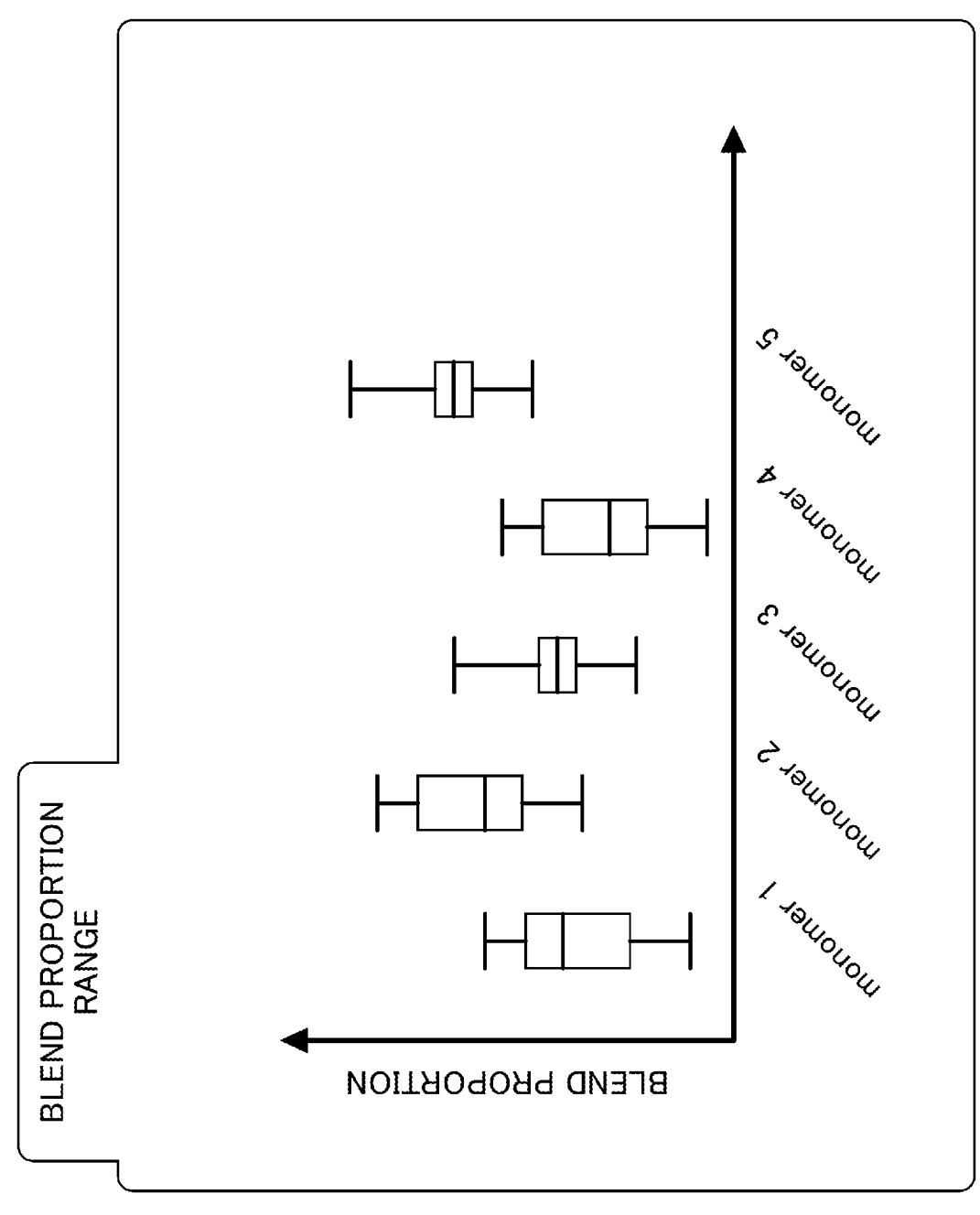
FIG. 10 A diagram illustrating an example of an output screen of an information display unit.

FIG. 8 is a diagram illustrating an example of an input screen 21A of the required physical property input unit 21. The items of the physical property value input as the required physical property include, for example, viscosity, glass transition point, color difference, molecular weight, acid value, developability (speed, development form, development residue), adhesiveness, transparency, sensitivity, solvent resistance (for example, NMP resistance), dispersibility, heat resistance (heat content phenomenon), heat resistance (yellowing color difference), and the like. In the input screen 21A, the minimum value and the maximum value of the required range can be input for each physical property value.

The filter unit 22 selects the comprehensive analysis point that satisfies the required range of the physical property value of the polymer input in the required physical property input unit 21 from the data set stored in the comprehensive analysis point-polymer physical property value storage unit 14.

As described above, in the inverse problem analysis unit 20, it is configured so that a material designer simply inputs a required range of at least one physical property value to obtain the blend proportion of multiple monomers required for polymerization of the polymer that satisfies all of the required range of the input physical property value.

The GUI 30 includes an information display unit 31. The information display unit 31 displays the output of the direct problem analysis unit 10 and the inverse problem analysis unit 20. For example, blend proportions of monomers and physical property values included in the data set selected in the inverse problem analysis unit 20 are displayed.

Figure 2:
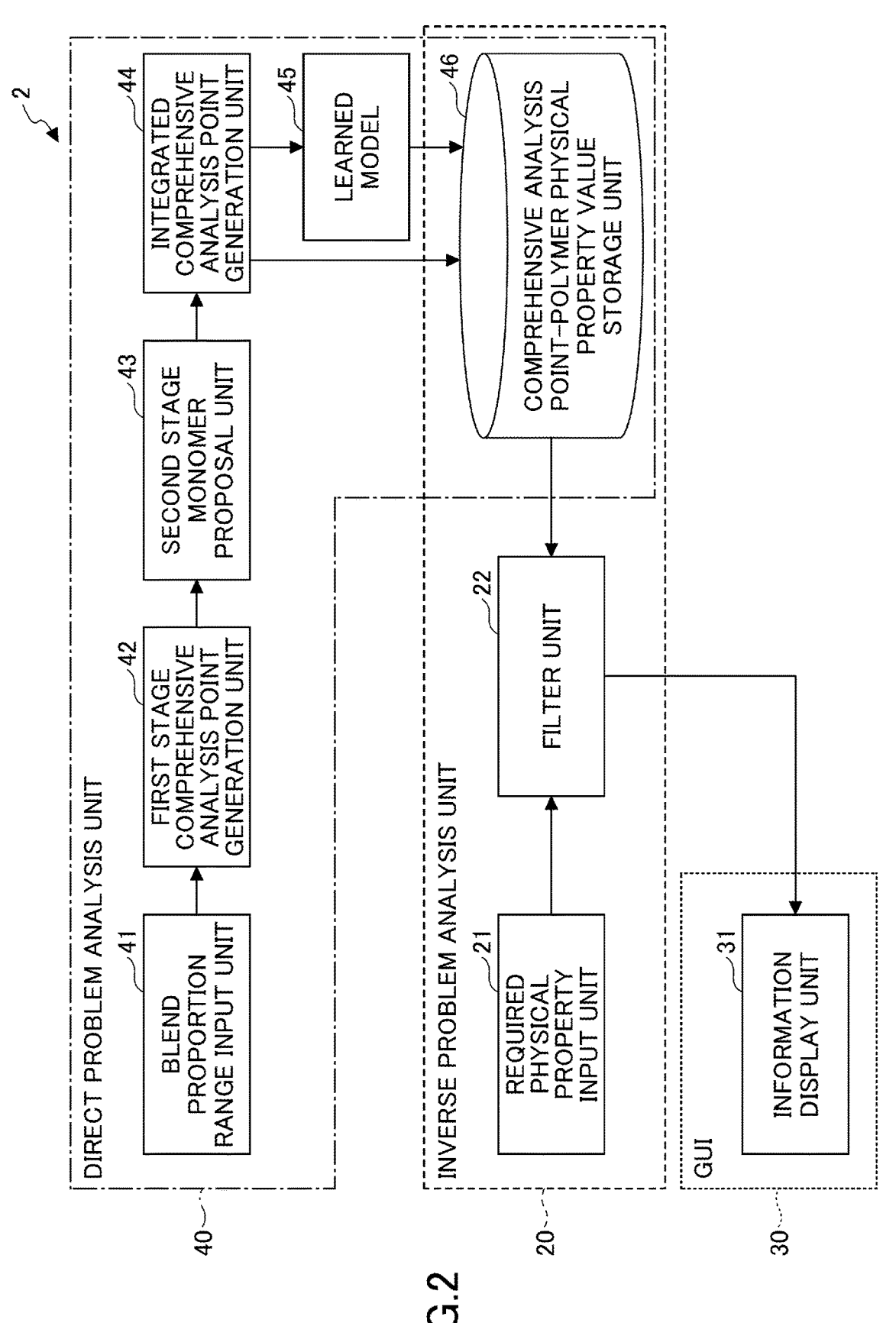
FIG. 2 A block diagram illustrating an example of a schematic configuration of a material design apparatus according to an embodiment.

Referring to FIG. 2, a configuration of a material design apparatus 2 according to the embodiment will be described.

FIG. 2 illustrates a schematic configuration of the material design apparatus 2, which is another example of a configuration of the material design apparatus according to an embodiment of the present invention. The material design apparatus 2 illustrated in FIG. 2 is a material design apparatus for designing a graft polymer polymerized in two stages from multiple types of monomers. The material design apparatus 2 includes a direct problem analysis unit 40, and, an inverse problem analysis unit 20 and a GUI 30 similar to those included in the material design apparatus 1 described above. Hereinafter, the direct problem analysis unit 40 having a configuration different from the direct problem analysis unit 10 included in the material design apparatus 1 will be described.

The direct problem analysis unit 40 included in the material design apparatus 2 includes a blend proportion range input unit 41, a first stage comprehensive analysis point generation unit 42, a second stage monomer proposal unit 43, an integrated comprehensive analysis point generation unit 44, a learned model 45, and a comprehensive analysis point-polymer physical property value storage unit 46.

To the blend proportion range input unit 41, a blend proportion range of at least one monomer constituting the polymer to be designed is input. For example, the blend proportion range input unit 41 may display a monomer list to be analyzed, on the GUI 30, to receive input. As an input screen of the blend proportion range input unit 41, the input screen 11A of FIG. 3 as described above may be used.

In the first stage comprehensive analysis point generation unit 42, at least one first stage monomer used for the first stage polymerization is selected from among the monomers of which the blend proportion range is input, and a comprehensive analysis point of a main chain polymer is generated, the main chain polymer being polymerized using multiple monomers including at least one first stage monomer within the blend proportion range. For example, when monomer 1 and monomer 2 are selected as the first stage monomer from among the monomers of which the blend proportion range is input, first, multiple blend proportions, in a random or predetermined step width, are calculated within each of the input blend proportion range of monomer 1 and monomer 2. A first stage comprehensive analysis point is generated in which information that monomer 1 and monomer 2 are monomers constituting the main chain polymer is added to the calculated combinations of the blend proportions. The information that a monomer constitutes a main chain polymer is provided, for example, by changing the name of monomer 1 to monomer 1 (main chain). In this case, as the learned model 45, a learned model in which monomer 1 and monomer 1 (main chain) are learned as different substances is used.

In the second stage monomer proposal unit 43, based on the first stage comprehensive analysis point generated in the first stage comprehensive analysis point generation unit 42, at least one second stage monomer and a blend proportion of the second stage monomer are proposed. A graft polymer is polymerized by reaction with the second stage monomer and the main chain polymer. The blend proportion of the second stage monomer is proposed so that the sum of the blend proportions is 1 (that is, the total number of monomers constituting the graft polymer is 100%). For the proposal of the second stage monomer and its blend proportion, a learned model may be used in which a predetermined rule or a relationship between the first stage comprehensive analysis point and a manufacturable polymer composition is learned.

In the integrated comprehensive analysis point generation unit 44, the second stage monomer proposal unit 43 generates an integrated comprehensive analysis point of the graft polymer obtained by polymerizing the proposed second stage monomer with the main chain polymer at the proposed blend proportion. For example, when monomer 3 and monomer 4 are proposed as the second stage monomer, the element of which the blend proportion is finally determined is randomly determined. For example, when the blend proportion of monomer 4 is finally determined, first, the blend proportion of monomer 3 is created in a random or predetermined step width. At this time, when the blend proportion range of monomer 3 is input in the blend proportion range input unit 41, the range for calculating the blend proportion of monomer 3 is within the input blend proportion range. Next, the blend proportion of monomer 4 is determined so that the sum of the blend proportions of monomer 1 to monomer 4 is 1 (that is, the total number of monomers constituting the graft polymer is 100%). An integrated comprehensive analysis point of the graft polymer polymerized with the combination of the blend proportions of monomer 3 and monomer 4 is generated in which, among the generated combinations of the blend proportions, the combination of the blend proportions of monomer 3 and monomer 4 falls within the blend proportion range input in the blend proportion range input unit 41.

The learned model 45 may be the same as the learned model 13 described above. When a particular monomer is to be used for both the first stage monomer and the second stage monomer, a learned model in which the monomer is learned as different substances is used.

In the blend proportion range input unit 41, the number of monomers constituting the graft polymer may be input to limit the total number of monomers used for polymerization. When the total number of monomers used for polymerization is limited, in the integrated comprehensive analysis point generation unit 44, an integrated comprehensive analysis point of the graft polymer is generated in which the graft polymer is polymerized using the limited number of monomers.

In the blend proportion range input unit 41, at least one monomer may be input as essential for the first stage polymerization from among the monomers of which the blend proportion range is input. When an essential monomer essential for the first stage polymerization is input, in the first stage comprehensive analysis point generation unit 42, a first stage comprehensive analysis point of a main chain polymer polymerized from multiple monomers including the essential monomer within the blend proportion range is generated.

Figure 6:
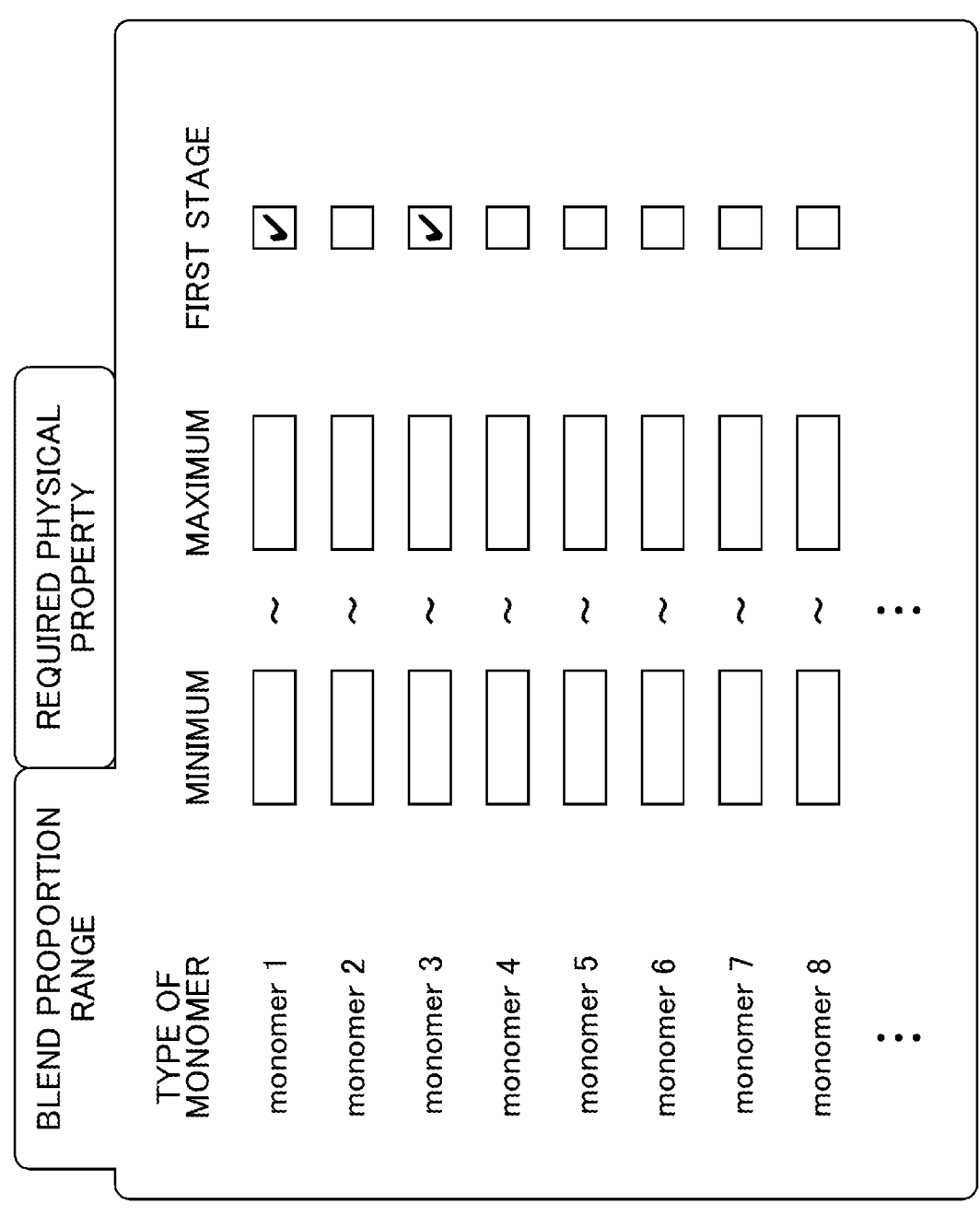
FIG. 6 A diagram illustrating an example of an input screen of the blend proportion range input unit.

FIG. 6 is a diagram illustrating an example of an input screen 41A of the blend proportion range input unit 41 when at least one monomer is input as essential for the first stage polymerization from among the monomers of which the blend proportion range is input. In the example of the input screen 41A, for each monomer, the minimum value and the maximum value of the blend proportion and the essential monomer used for the first stage polymerization can be input. In the example of the input screen 41A, monomer 1 and monomer 3 are input as the essential monomers for the first stage polymerization.

When the essential monomer is input, in the first stage comprehensive analysis point generation unit 42, a first stage comprehensive analysis point of a main chain polymer polymerized from multiple monomers including monomer 1 and monomer 3 as the respective essential monomers for the first stage polymerization within the blend proportion range, is generated.

In the blend proportion range input unit 41, the number of first stage monomers used for the first stage polymerization may be input and the number of monomers used for the first stage polymerization may be limited. When the number of monomers used for the first stage polymerization is limited, in the first stage comprehensive analysis point generation unit 42, the comprehensive analysis point of a main chain polymer polymerized using a limited number of monomers is generated.

Figure 7:
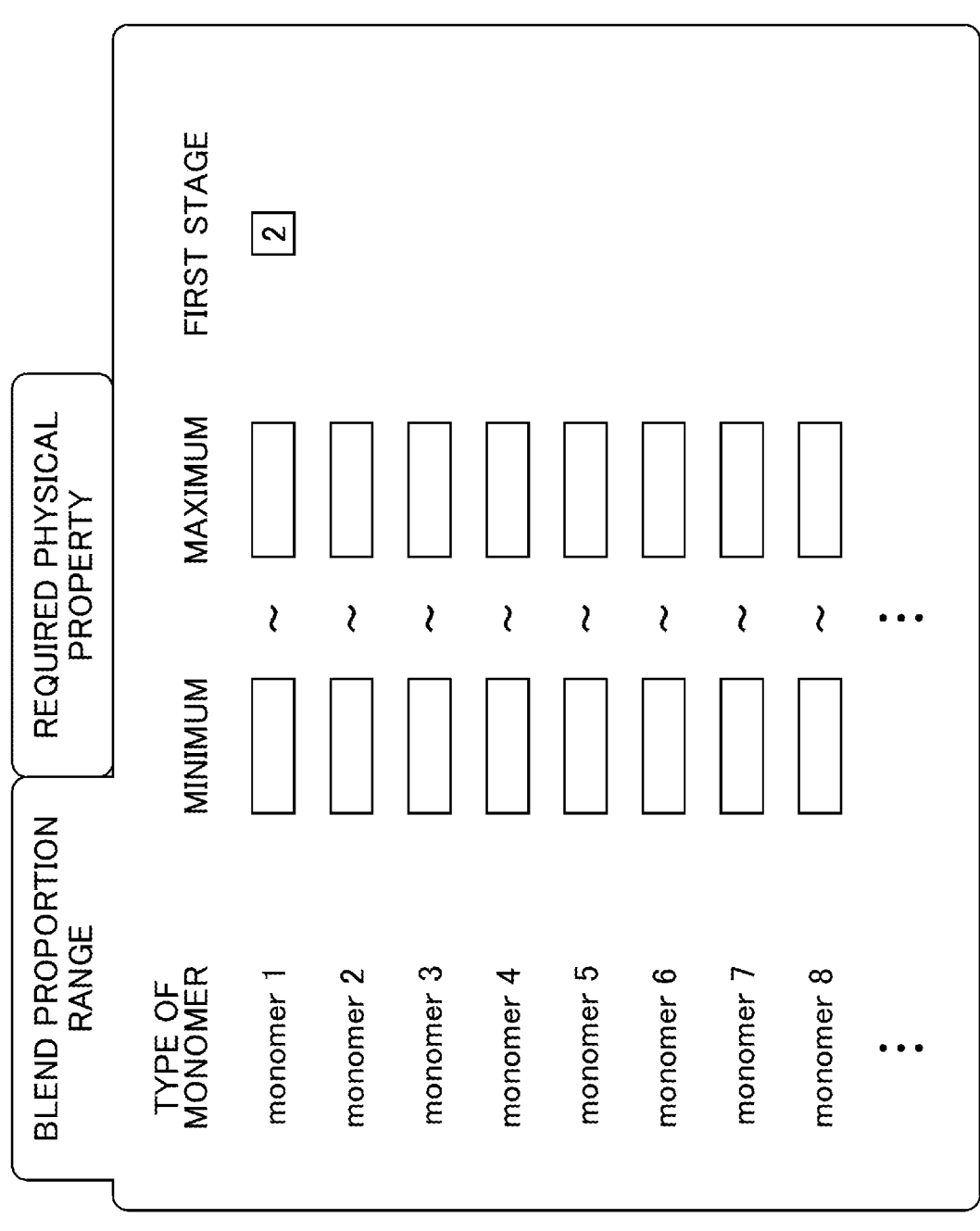
FIG. 7 A diagram illustrating an example of an input screen of the blend proportion range input unit.

FIG. 7 is a diagram illustrating an example of an input screen 41B of the blend proportion range input unit 41. In the input screen 41B, the number of monomers used for the first stage polymerization can be input. In the example of the input screen 41B, "2" is input as the number of first stage monomers used for the first stage polymerization.

The comprehensive analysis point-polymer physical property value storage unit 46 inputs the integrated comprehensive analysis point generated by the integrated comprehensive analysis point generation unit 44 into the learned model 45 to calculate the physical property value of the polymer, creates a data set in which the integrated comprehensive analysis point and the calculated physical property value of the polymer are linked, and stores the created data set.

As described above, in the direct problem analysis unit 40, it is configured so that a material designer simply inputs a blend proportion range of at least one monomer, and a data set is automatically generated that includes a comprehensive analysis point and a physical property value of the graft polymer covering all of the blend proportion range of the monomer.

The inverse problem analysis unit 20 provided by the material design apparatus 2 includes the required physical property input unit 21 and the filter unit 22. The comprehensive analysis point-polymer physical property value storage unit 46 described above is also included in the inverse problem analysis unit 20.

The filter unit 22 selects the data set that satisfies the required range of the physical property value of the polymer input in the required physical property input unit 21 from the comprehensive analysis point-polymer physical property value storage unit 46. The selected data set may include all structural isomers as long as they are polymers that satisfy the required range of the input physical property value.

The inverse problem analysis unit 20 and the GUI 30 provided by the material design apparatus 2 are of the same configuration as that provided by the material design apparatus 1 described above.

Figure 11:
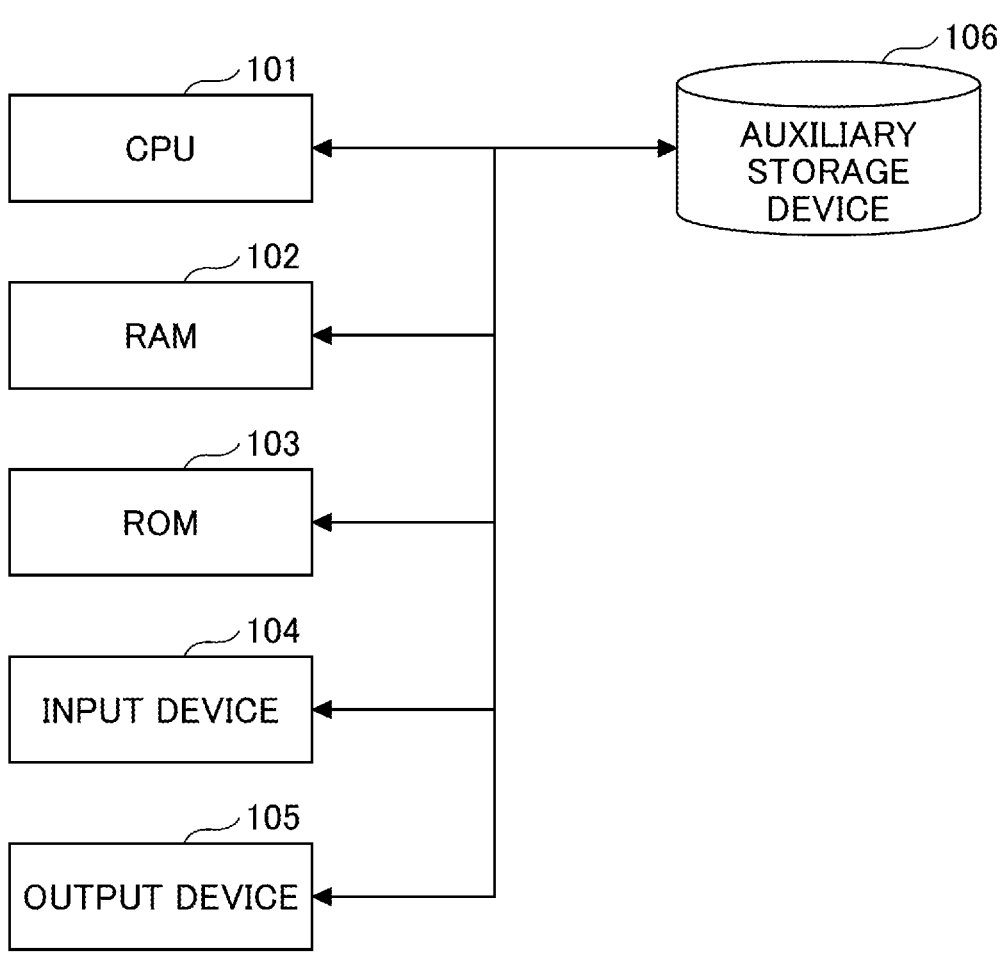
FIG. 11 A block diagram illustrating an example of a hardware configuration of a material design apparatus.

FIG. 11 is a block diagram illustrating a hardware configuration of the material design apparatus 1. As illustrated in FIG. 11, the material design apparatus 1 may be configured as a computer system that includes, physically, a central processing unit (CPU) 101, a random access memory (RAM) 102 as a main storage device, a read only memory (ROM) 103, an input device 104 such as a keyboard and a mouse, an output device 105 such as a display, an auxiliary storage device 106 such as a hard disk, and the like. The material design apparatus 2 may also have a hardware configuration similar to that of the material design apparatus 1.

Each function of the material design apparatus 1 illustrated in FIG. 1 is implemented by reading predetermined computer software (material design program) on hardware such as the CPU 101 and the RAM 102, and operating the input device 104 and the output device 105 under the control of the CPU 101, and reading and writing data in the RAM 102 and the auxiliary storage device 106. That is, by executing the material design program according to the present embodiment on a computer, the material design apparatus 1 functions as the blend proportion range input unit 11, the comprehensive analysis point generation unit 12, the required physical property input unit 21, the filter unit 22, and the information display unit 31 illustrated in FIG. 1. A model creation function and a data set creation function may also be implemented. The model creation function is a function of creating the learned model 13 in which the correspondence between input information about a blend proportion of monomers and output information about a physical property value of a polymer is acquired by machine learning. The data set creation function is a function of inputting the comprehensive analysis point generated by the comprehensive analysis point generation function into the learned model 13 to calculate the physical property value of the polymer, and storing, in the comprehensive analysis point-polymer physical property value storage unit 14, a data set in which the calculated physical property value of the polymer and each point of the comprehensive analysis point are linked. The comprehensive analysis point-polymer physical property value storage unit 14 illustrated in FIG. 1 may be implemented by a part of a storage device (such as the RAM 102, the ROM 103, and the auxiliary storage device 106) provided by a computer. The GUI 30 illustrated in FIG. 1 may be implemented by the output device 105 or the input device 104 provided by a computer.

The material design program of the present embodiment is stored, for example, in a storage device provided by a computer. The material design program may have a configuration in which a part or all of the material design program is transmitted via a transmission medium such as a communication line, received by a communication module or the like provided by a computer, and recorded (including "installed"). The material design program may have a configuration in which a part or all of the material design program is recorded (including "installed") in a computer from a state where the material design program is stored in a portable storage medium such as a CD-ROM, a DVD-ROM, or a flash memory.

Figure 12:
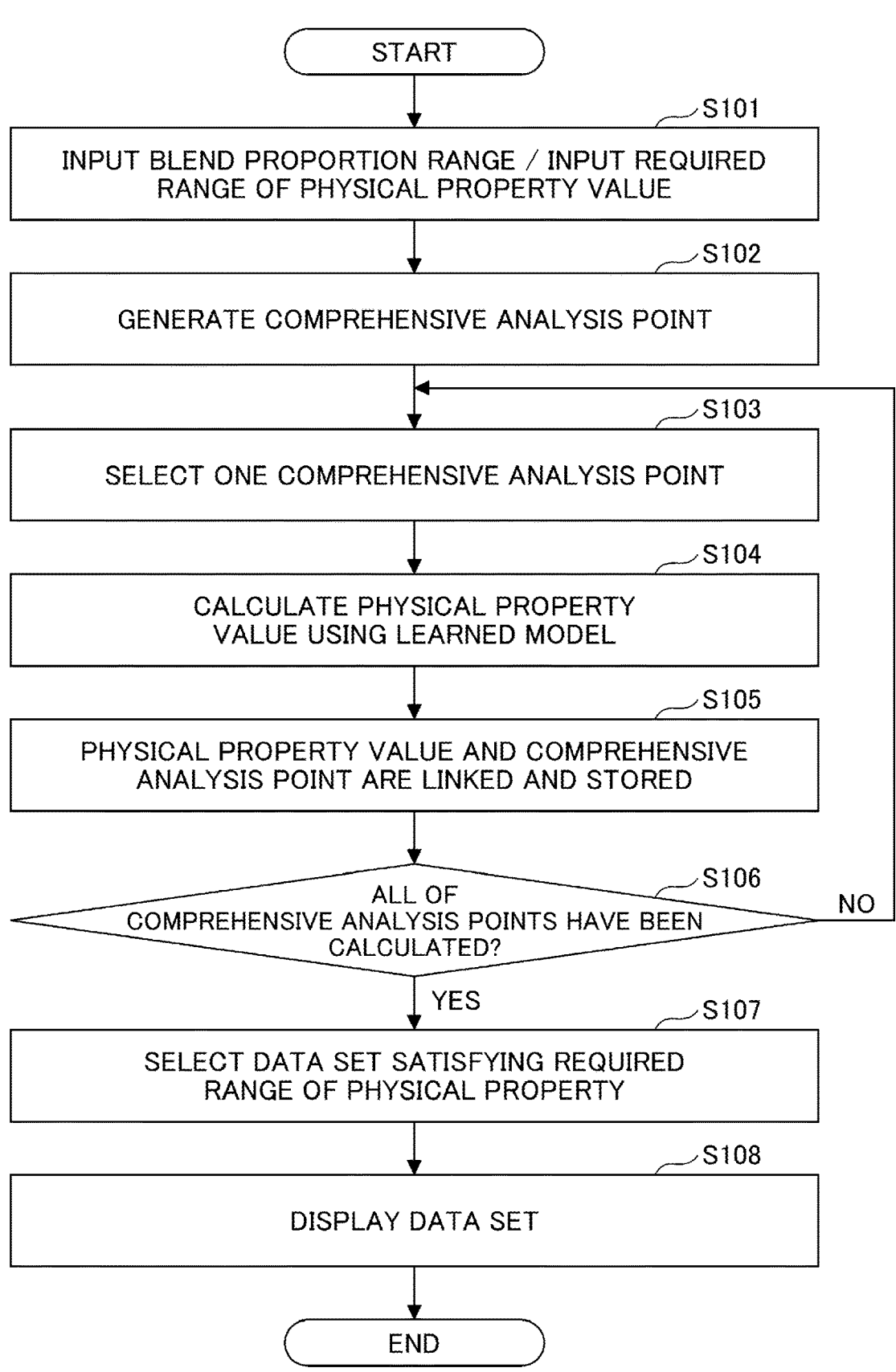
FIG. 12 An example of a flow chart of a process performed by a direct problem analysis unit and an inverse problem analysis unit.

Referring to FIG. 12, a material design method using the material design apparatus 1 according to the embodiment will be described.

Before the analysis process of FIG. 12 is performed, a process (model creation step) is performed that creates the learned model 13 in which the correspondence between input information including a blend proportion range of a polymer and output information including a physical property value of a polymer is learned by machine learning. The model creation step may be performed by the material design apparatus 1. Alternatively, the model creation step may be performed by another apparatus, and the material design apparatus 1 may be configured to use the learned model 13 created by the other apparatus.

In step S101, inputting a blend proportion range and inputting a required range of a physical property value are performed. The blend proportion range input unit 11 performs inputting a blend proportion range of at least one monomer constituting the polymer to be designed, and the required physical property input unit 21 performs inputting a required range of at least one physical property value of the polymer (a design condition setting step). For example, the blend proportion range input unit 11 displays the input screen 11A illustrated in FIG. 3 on the GUI 30 to cause a material designer to input a blend proportion range, and displays the input screen 21A illustrated in FIG. 8 on the GUI 30 to cause the material designer to input a required range of a physical property value of the polymer.

In step S102, the comprehensive analysis point generation unit 12 generates the comprehensive analysis point of the polymer polymerized using multiple monomers including at least one monomer of which a blend proportion range is input in step S101 within the blend proportion range (comprehensive analysis point generation step).

In steps S103 to S106, the direct problem analysis unit 10 inputs the comprehensive analysis point generated in step S102 into the learned model 13 to calculate the physical property value of the polymer, creates a data set in which the comprehensive analysis point and the calculated physical property value of the polymer are linked, and stores the created data set in the comprehensive analysis point-polymer physical property value storage unit 14 (data set creation step).

First, in step S103, one comprehensive analysis point is selected. In step S104, the selected comprehensive analysis point is input to the learned model 13 to calculate the physical property value of the polymer. In step S105, the comprehensive analysis point input in the learned model 13 and the physical property value of the material output from the learned model 13 are linked. By the processing of steps S103 to S105, one data set is generated. The generated data set is stored in the comprehensive analysis point-polymer physical property value storage unit 14.

In step S106, it is determined whether all of the comprehensive analysis points have been calculated. When not all of the comprehensive analysis points have been calculated (NO in step S106), the process returns to step S103 and the selection of the comprehensive analysis point is repeated. When all of the comprehensive analysis points have been calculated (YES in step S106), the generation of the data set is completed and the process proceeds to step S107.

In step S107, the inverse problem analysis process is performed by selecting the data set that satisfies the required range of the physical property value of the polymer input by the required physical property input unit 21 from the comprehensive analysis point-polymer physical property value storage unit 14 (filter step).

In step S100, based on the data set selected in step S107, the information display unit 31 displays on the GUI 30 the blend proportion of the monomer that satisfies the required range of the physical property value of the polymer input in step S101. For example, the information display unit 31 displays on the GUI 30 an output screen 31A illustrated in FIG. 10.

The effect of the present embodiment will be described. The material design apparatus 1 according to the present embodiment includes, as the direct problem analysis unit 10, the blend proportion range input unit 11 configured to receive as input a blend proportion range of at least one monomer, the comprehensive analysis point generation unit 12 configured to generate a comprehensive analysis point of a polymer polymerized using multiple monomers including at least one monomer of which a blend proportion range is input within the blend proportion range, and the comprehensive analysis point-polymer physical property value storage unit 14 configured to input the comprehensive analysis point generated by the comprehensive analysis point generation unit 12 into the learned model 13 to calculate a physical property value of the polymer, to create a data set in which the comprehensive analysis point and the calculated physical property value of the polymer are linked, and to store the created data set. The inverse problem analysis unit 20 includes the required physical property input unit 21 configured to receive as input the required range of physical property value of the polymer and the filter unit 22 configured to select the data set that satisfies the required range of the physical property value input by the required physical property input unit 21.

As described above, in the present embodiment, during the direct problem analysis, a data set to be used in the inverse problem analysis is created and stored in the comprehensive analysis point-polymer physical property value storage unit 14. When performing the inverse problem analysis, the data set that satisfies the required range of the physical property value of the polymer is selected by referring to the data set stored in the comprehensive analysis point-polymer physical property value storage unit 14. In other words, in the inverse problem analysis, only the work of searching the data set stored in the comprehensive analysis point-polymer physical property value storage unit 14 is performed without performing any numerical calculation such as simulation or model calculation. Thus, the calculation cost can be significantly reduced, and the optimal solution of the blend proportion of the monomer capable of forming the polymer that satisfies the required range of the desired physical property value can be derived in a short time.

In the inverse problem analysis by conventional simulation or one in which the machine learning system is applied to the inverse problem analysis, when there are multiple required physical properties, calculation is performed so that the optimal solution is gradually reached while sequentially adjusting each of the physical properties. The search for candidate material is not performed collectively so as to simultaneously satisfy the multiple types of physical properties. In many cases, multiple physical properties of material are in a trade-off relationship with each other. Thus, because trial and error is repeated until the optimal solution is reached, it takes a long time to obtain the optimal solution of the design condition that satisfies the desired physical properties of the material. In contrast, in the present embodiment, by setting an output (physical property values of a polymer) of the learned model 13 to be more than one and creating items of the multiple property values of the polymer in the comprehensive analysis point-polymer physical property value storage unit 14, the search for the blend proportion of the monomers in the inverse problem analysis can be collectively performed so as to simultaneously satisfy the multiple types of physical property values of the polymer. Accordingly, even when multiple types of required ranges of physical property values are set, the time required to derive the optimal solution can be significantly reduced compared to the conventional method.

Further, because the data set stored in the comprehensive analysis point-polymer physical property value storage unit 14 is derived from the large amount of comprehensive analysis point automatically generated in the direct problem analysis, the step width of each item of the blend proportion range or the required range of the physical property value is sufficiently small, and the resolution is high. Therefore, in the inverse problem analysis, it is possible to accurately predict the design condition that satisfies the required range of the physical property value.

As described above, the present embodiment has been described with reference to the specific examples. However, the present disclosure is not limited to these specific examples. These specific examples with appropriate design changes by those skilled in the art are also included in the scope of the present disclosure as long as they have the features of the present disclosure. Each element included in each of the specific examples described above, its arrangement, conditions, shapes, and the like are not limited to those exemplified, and can be appropriately changed. The combinations of the elements included in each of the specific examples described above can be appropriately changed as long as there is no technical contradiction.

The present application claims priority to Japanese Patent Application No. 2019-163105, filed Sep. 6, 2019 with the Japanese Patent Office. The contents of which are incorporated herein by reference in their entirety.

DESCRIPTION OF THE REFERENCE NUMERAL 1 material design apparatus
2 material design apparatus
10 direct problem analysis unit
20 inverse problem analysis unit
30 GUI
11 blend proportion range input unit
12 comprehensive analysis point generation unit
13 learned model
14 comprehensive analysis point-polymer physical property value storage unit 21 required physical property input unit
22 filter unit
31 information display unit
40 direct problem analysis unit
41 blend proportion range input unit
42 first stage comprehensive analysis point generation unit
43 second stage monomer proposal unit
44 integrated comprehensive analysis point generation unit
45 learned model
46 comprehensive analysis point-polymer physical property value storage unit

The invention claimed is:

1. A material design apparatus for designing a polymer polymerized from multiple types of monomers, the material design apparatus comprising:
   a learned model that has learned a correspondence between input information about a blend proportion of a monomer and output information about a plurality of physical property values of a polymer by machine learning,
   a blend proportion range input unit configured to receive as input a blend proportion range of at least one monomer,
   a required physical property input unit configured to receive as input required ranges of a plurality of physical property values of a polymer,
   a comprehensive analysis point generation unit configured to generate a comprehensive analysis point of a polymer polymerized from multiple monomers, the multiple monomers including, within the blend proportion range, at least one monomer of which the blend proportion range is input,
   a comprehensive analysis point-polymer physical property value storage unit configured to input the generated comprehensive analysis point into the learned model to calculate a plurality of physical property values of a polymer, to create a data set in which the comprehensive analysis point and the calculated physical property values of the polymer are linked, and to store the created data set, and
   a filter unit configured to select a polymer within the required ranges of the physical property values input in the required physical property input unit from the data set.

2. The material design apparatus according to claim 1, wherein in the blend proportion range input unit, a number of monomers used for polymerization is input, and the number of monomers used for polymerization is limited, and wherein a comprehensive analysis point of a polymer polymerized using a limited number of monomers is generated.

3. The material design apparatus according to claim 1, wherein in the blend proportion range input unit, at least one monomer is input as essential for polymerization from among monomers of which the blend proportion range is input, and wherein a comprehensive analysis point of a polymer polymerized from multiple monomers including an essential monomer within the blend proportion range is generated.

4. A material design apparatus for designing a graft polymer polymerized in two stages from multiple types of monomers, the material design apparatus comprising:
   a learned model that has learned a correspondence between input information about a blend proportion of a monomer and output information about a plurality of physical property values of a polymer by machine learning, a blend proportion range input unit configured to receive as input a blend proportion range of at least one monomer, a required physical property input unit configured to receive as input required ranges of a plurality of physical property values of a polymer, a first stage comprehensive analysis point generation unit configured to select at least one first stage monomer used for first stage polymerization from among monomers of which the blend proportion range is input, and to generate a comprehensive analysis point of a main chain polymer polymerized using multiple monomers including the at least one first stage monomer within the blend proportion range, a second stage monomer proposal unit configured to propose at least one second stage monomer used for a second stage polymerization with the main chain polymer based on a first stage comprehensive analysis point, an integrated comprehensive analysis point generation unit configured to generate an integrated comprehensive analysis point of a graft polymer obtained by polymerizing the second stage monomer with the main chain polymer, a comprehensive analysis point-polymer physical property value storage unit configured to input the integrated comprehensive analysis point into the learned model to calculate a plurality of physical property values of a graft polymer, to create a data set in which the integrated comprehensive analysis point and the calculated physical property values of the graft polymer are linked, and to store the created data set, and a filter unit configured to select a graft polymer within the required ranges of the physical property values input in the required physical property input unit from the data set.

5. The material design apparatus according to claim 4, wherein in the blend proportion range input unit, a number of monomers used for polymerization is input, and the number of monomers used for polymerization is limited, and wherein an integrated comprehensive analysis point of a graft polymer polymerized using a limited number of monomers is generated.

6. The material design apparatus according to claim 4, wherein in the blend proportion range input unit, at least one monomer is input as essential for polymerization from among monomers of which the blend proportion range is input, and wherein in the integrated comprehensive analysis point generation unit, a comprehensive analysis point of a graft polymer polymerized from multiple monomers including an essential monomer within the blend proportion range is generated.

7. The material design apparatus according to claim 4, wherein in the blend proportion range input unit, at least one monomer is input as essential for first stage polymerization from among monomers of which the blend proportion range is input, and wherein in the first stage comprehensive analysis point generation unit, a comprehensive analysis point of a main chain polymer polymerized from multiple monomers including an essential monomer within the blend proportion range is generated.

8. A material design method for designing a polymer polymerized from multiple types of monomers, the material design method comprising:

creating a learned model that has learned a correspondence between input information about a blend proportion of a monomer and output information about a plurality of physical property values of a polymer by machine learning, receiving as input a blend proportion range of at least one monomer, receiving as input required ranges of a plurality of physical property values of a polymer, generating a comprehensive analysis point of a polymer polymerized using, within the blend proportion range, at least one monomer of which the blend proportion range is input, inputting the comprehensive analysis point into the learned model to calculate a plurality of physical property values of a polymer, creating a data set in which the comprehensive analysis point and the calculated physical property values of the polymer are linked, and storing the created data set in a comprehensive analysis point-polymer physical property value storage unit, and selecting a polymer within the required ranges of the physical property values from the data set.

9. A non-transitory computer-readable recording medium storing a material design program for designing a polymer polymerized from multiple types of monomers, the material design program causing a computer to implement functions comprising:

creating a learned model that has learned a correspondence between input information about a blend proportion of a monomer and output information about a plurality of physical property values of a polymer by machine learning, receiving as input a blend proportion range of at least one monomer, receiving as input required ranges of a plurality of physical property values of a polymer, generating a comprehensive analysis point of a polymer polymerized using, within the blend proportion range, at least one monomer of which the blend proportion range is input, inputting the comprehensive analysis point into the learned model to calculate a plurality of physical property values of a polymer, creating a data set in which the comprehensive analysis point and the calculated physical property values of the polymer are linked, and storing the created data set in a comprehensive analysis point-polymer physical property value storage unit, and selecting a polymer within the required ranges of the physical property values from the data set.

10. The material design apparatus according to claim 4, wherein when a particular monomer is selected as the first stage monomer, a learned model that has learned the particular monomer and a monomer constituting the main chain polymer as different substances is used.

11. A material design method for designing a graft polymer polymerized in two stages from multiple types of monomers, the material design method comprising:

creating a learned model that has learned a correspondence between input information about a blend proportion of a monomer and output information about a plurality of physical property values of a polymer by machine learning, receiving as input a blend proportion range of at least one monomer, receiving as input required ranges of a plurality of physical property values of a polymer, selecting at least one first stage monomer used for first stage polymerization from among monomers of which the blend proportion range is input, and to generate a comprehensive analysis point of a main chain polymer polymerized using multiple monomers including the at least one first stage monomer within the blend proportion range, proposing at least one second stage monomer used for a second stage polymerization with the main chain polymer based on a first stage comprehensive analysis point, generating an integrated comprehensive analysis point of a graft polymer obtained by polymerizing the second stage monomer with the main chain polymer, inputting the integrated comprehensive analysis point into the learned model to calculate a plurality of physical property values of a graft polymer, to create a data set in which the integrated comprehensive analysis point and the calculated physical property values of the graft polymer are linked, and to store the created data set, and selecting a graft polymer within the required ranges of the physical property values from the data set.

12. A non-transitory computer-readable recording medium storing a material design program for designing a graft polymer polymerized in two stages from multiple types of monomers, the material design program causing a computer to implement functions comprising:

creating a learned model that has learned a correspondence between input information about a blend proportion of a monomer and output information about a plurality of physical property values of a polymer by machine learning, receiving as input a blend proportion range of at least one monomer, receiving as input required ranges of a plurality of physical property values of a polymer, selecting at least one first stage monomer used for first stage polymerization from among monomers of which the blend proportion range is input, and to generate a comprehensive analysis point of a main chain polymer polymerized using multiple monomers including the at least one first stage monomer within the blend proportion range, proposing at least one second stage monomer used for a second stage polymerization with the main chain polymer based on a first stage comprehensive analysis point, generating an integrated comprehensive analysis point of a graft polymer obtained by polymerizing the second stage monomer with the main chain polymer, inputting the integrated comprehensive analysis point into the learned model to calculate a plurality of physical property values of a graft polymer, to create a data set in which the integrated comprehensive analysis point and the calculated physical property values of the graft polymer are linked, and to store the created data set, and selecting a graft polymer within the required ranges of the physical property values from the data set.

13. The material design apparatus according to claim 4, wherein the second stage monomer proposal unit is configured to further propose a blend proportion of the second stage monomer, and the integrated comprehensive analysis point generation unit is configured to generate the integrated comprehensive analysis point of the graft polymer obtained by polymerizing the second stage monomer with the main chain polymer at the proposed blend proportion.

14. The material design method according to claim 11, wherein in the proposing of the at least one second stage monomer, a blend proportion of the second stage monomer is further proposed, and in the generating of the integrated comprehensive analysis point of the graft polymer, the integrated comprehensive analysis point of the graft polymer obtained by polymerizing the second stage monomer with the main chain polymer at the proposed blend proportion is generated.

15. The non-transitory computer-readable recording medium according to claim 12, wherein in the proposing of the at least one second stage monomer, a blend proportion of the second stage monomer is further proposed, and in the generating of the integrated comprehensive analysis point of the graft polymer, the integrated comprehensive analysis point of the graft polymer obtained by polymerizing the second stage monomer with the main chain polymer at the proposed blend proportion is generated.

* * * * *